United States Patent
Shanker

(10) Patent No.: US 7,951,683 B1
(45) Date of Patent: May 31, 2011

(54) IN-SITU PROCESS LAYER USING SILICON-RICH-OXIDE FOR ETCH SELECTIVITY IN HIGH AR GAPFILL

(75) Inventor: Sunil Shanker, Santa Clara, CA (US)

(73) Assignee: Novellus Systems, Inc, San Jose, CA (US)

( * ) Notice: Subject to any disclaimer, the term of this patent is extended or adjusted under 35 U.S.C. 154(b) by 524 days.

(21) Appl. No.: 11/697,611

(22) Filed: Apr. 6, 2007

(51) Int. Cl.
    *H01L 21/76* (2006.01)
(52) U.S. Cl. ........ 438/404; 438/219; 438/295; 438/597; 438/788; 257/E21.545; 257/E21.546; 257/E21.55; 257/E21.553; 257/E21.585
(58) Field of Classification Search .................. 438/219, 438/295, 404, 787, 788, 597; 257/E21.545, 257/E21.546, E21.55, E21.553, E21.585
    See application file for complete search history.

(56) References Cited

U.S. PATENT DOCUMENTS

| | | | |
|---|---|---|---|
| 4,352,724 A * | 10/1982 | Sugishima et al. | 204/192.37 |
| 6,001,414 A * | 12/1999 | Huang et al. | 438/622 |
| 6,030,881 A | 2/2000 | Papasouliotis et al. | |
| 6,335,261 B1 | 1/2002 | Natzle et al. | |
| 6,395,150 B1 | 5/2002 | Van Cleemput et al. | |
| 6,596,654 B1 | 7/2003 | Bayman et al. | |
| 6,787,483 B1 | 9/2004 | Bayman et al. | |
| 6,794,290 B1 | 9/2004 | Papasouliotis et al. | |
| 6,846,745 B1 | 1/2005 | Papasouliotis et al. | |
| 6,867,086 B1 | 3/2005 | Chen et al. | |
| 7,067,440 B1 | 6/2006 | Bayman et al. | |
| 7,078,312 B1 | 7/2006 | Sutanto et al. | |
| 7,097,886 B2 * | 8/2006 | Moghadam et al. | 427/569 |
| 7,122,485 B1 | 10/2006 | Papasouliotis et al. | |
| 7,176,039 B1 * | 2/2007 | Papasouliotis et al. | 438/5 |
| 7,211,525 B1 * | 5/2007 | Shanker et al. | 438/788 |
| 7,217,658 B1 | 5/2007 | Bayman et al. | |
| 7,476,621 B1 | 1/2009 | Nguyen et al. | |
| 7,482,245 B1 | 1/2009 | Yu et al. | |
| 2004/0079632 A1 * | 4/2004 | Ahmad et al. | 204/192.3 |

* cited by examiner

*Primary Examiner* — Alexander G Ghyka
*Assistant Examiner* — Leonard Chang
(74) *Attorney, Agent, or Firm* — Weaver Austin Villeneuve & Sampson LLP

(57) ABSTRACT

In-situ semiconductor process that can fill high aspect ratio (typically at least 6:1, for example 7:1 or higher), narrow width (typically sub 0.13 micron, for example 0.1 micron or less) gaps with significantly reduced incidence of voids or weak spots is provided. This deposition part of the process may involve the use of any suitable high density plasma chemical vapor deposition (HDP CVD) chemistry. Prior to etch back, the feature gap is plugged with an etch selectivity layer. The etch back part of the process involves multiple steps including a sputter etch to reduce the top hat formations followed by a reactive plasma etch to open the gap. This method improves gapfill, reduces the use of high cost fluorine-based etching and produces interim gaps with better sidewall profiles and aspect ratios.

23 Claims, 5 Drawing Sheets

IN-SITU PROCESS LAYER USING SILICON-RICH-OXIDE FOR ETCH SELECTIVITY IN HIGH AR GAPFILL

FIELD OF THE INVENTION

This invention relates to electronic device fabrication processes and associated apparatus. More specifically, the invention relates to chemical vapor deposition and dry etch processes for forming dielectric layers, particularly in high aspect ratio, narrow width recessed features.

BACKGROUND OF THE INVENTION

It is often necessary in semiconductor processing to fill high aspect ratio gaps with insulating material. This is the case for shallow trench isolation, inter-metal dielectric layers, pre-metal dielectric layers, passivation layers, etc. As device geometries shrink and thermal budgets are reduced, void-free filling of narrow width, high aspect ratio spaces (e.g., AR>3:1, and particularly AR>6:1) becomes increasingly difficult due to limitations of existing deposition processes.

High density plasma (HDP) chemical vapor deposition (CVD), a directional (bottom-up) CVD process, is the method currently used for high aspect ratio gapfill. HDP CVD deposits more material at the bottom of a high aspect ratio structure than on its sidewalls. It accomplishes this by directing charged dielectric precursor species downward, to the bottom of the gap while simultaneously removing deposited material from the trench top through sputtering by the use of biased RF power applied to the substrate. Thus, HDP CVD is not an entirely diffusion-based or isotropic process.

However, there is still formation of cusps, also known as overhangs, at the entry region of the gap to be filled. These formations result from sputtering and redeposition processes. The directional aspect of the deposition process produces some high momentum charged species that sputter away material from within the gap. The sputtered material tends to redeposit on the sidewalls of high AR structures. As a result, the entry region of a high aspect ratio structure may close before bottom-up fill has been completed, leaving voids or weak spots within the structure. This phenomenon, known as "pinch-off," is exacerbated in narrow features. The overhangs cannot be totally eliminated because non-directional reactions of neutral species and sputtering and redeposition reactions are inherent to the physics and chemistry of the HDP CVD processes.

Furthermore, as aspect ratios increase, the shape of the gap itself can contribute to the problem. High aspect ratio gaps often exhibit reentrant features, which make gap filling even more difficult. The most problematic reentrant feature is a narrowing at the top of the gap, wherein the side-walls slope inward near the top of the gap. For a given aspect ratio feature, this increases the ratio of gap volume to be filled to gap entry area seen by the precursor species during deposition. Hence voids or weak spots become even more likely.

In addition to undesirable formations inside the feature, a peak of dielectric material often called a "top hat" forms on the top surface of the substrate on either side of the features. Top hats are deposits of material in the shape of a peak that slopes downwards towards the entry to the gap. If not removed, the top hats may "shadow" subsequent deposition because they can restrict the angles of incidence with which the deposition species must approach the gap in order to achieve bottom-up fill. The shadowing effectively makes the aspect ratio of the gap even higher.

In some gap fill applications, particularly in the case of small features with high aspect ratios, a multi-step deposition/etch back process has been used in order to remove the overhangs, reduce the top hats, and facilitate void-free gap fill. For example, a deposition and etch process utilizing HDP CVD deposition and an aqueous HF dip for the etch back step has been used. However, this requires that the wafers be cycled between the plasma deposition system and the wet etch back system for up to five cycles. This results in a very inefficient and low throughput (e.g., about 3 wafers per hour (wph)) process for the gap fill.

In-situ multi-step deposition/etch processes have also been used to keep the entry to the gap from closing before it is filled. Such in-situ HDP CVD deposition and etch back processes are described, for example, in U.S. Pat. Nos. 6,335,261, 6,030,881, 6,395,150, and 6,867,086, the disclosures of which are incorporated herein by reference for all purposes. Some of these in-situ etch back processes use high-energy ions (e.g. helium from the HDP plasma) to create a significantly anisotropic sputter etch. Other in-situ etch back processes use chemically-reactive etch gases (e.g. nitrogen trifluoride, $NF_3$) to create a significantly isotropic dry plasma etch.

In many instances, these sputter etch and reactive plasma etch processes damage the underlying structure of the features on the substrate. For example, in STI structures, a SiN liner is often deposited to enhance electrical isolation between various device elements and improve device performance. The liner can be eroded via several chemical or physical pathways, resulting in compromised device performance (usually demonstrated by higher leakage current).

While these in-situ multi-step deposition and etch back processes have improved high aspect ratio gap fill capabilities, dielectric deposition processes that can reliably fill high aspect ratio features of narrow width, particularly very small features (e.g., about 0.1 um gap width) with aspect ratios of about 6:1 or more, without leaving voids, continue to be sought. A method to reliably fill the features without causing detrimental damage to the underlying structure is still needed.

SUMMARY OF THE INVENTION

The present invention addresses this need by providing high density plasma chemical vapor deposition (HDP CVD) of a dielectric layer, followed by HDP chemical vapor deposition of an etch selectivity layer, and subsequently providing an etch back process. This multi-step process can be repeated as necessary to fill high aspect ratio (typically at least 6:1, for example 7:1 or higher), narrow width (typically sub 0.13 micron, for example 0.1 micron or less) gaps with significantly reduced incidence of voids or weak spots.

The dielectric deposition part of the process may involve the use of any suitable HDP CVD chemistry to fill the gap with silicon oxide or another suitable dielectric. Following dielectric deposition, but prior to etch back, an HDP CVD etch selectivity layer is deposited to significantly plug (e.g. reduce gap entrance area by greater than 50%) or entirely close the feature gap. The appropriate etch selectivity layer is chosen based on two etch selectivity ratios. The selectivity layer should be at least as resistant to sputter etch as the dielectric fill, but easier to chemically etch than the dielectric fill. An appropriate etch selectivity layer may be silicon rich oxide (SRO), silicon nitride, amorphous silicon, or a combination of these materials. For example, an SRO layer having a thickness of about 10 to 1000 angstroms may be a good etch selectivity layer, depending on the width of the gap and/or remaining profile opening and throughput considerations.

The etch back part of the process involves both sputter etching and reactive plasma etching. A sputter etch may apply bias to the substrate pedestal to induce ion bombardment at the substrate surface for a period of about 10-150 seconds, for example about 60 seconds, depending on the source and bias powers used for different sputter chemistries. The sputtering gas may comprise hydrogen, deuterium, helium, nitrogen, argon, or a combination of these. The sputter etching can reduce the size of top hats adjacent to a gap opening without completely opening the gap.

The etch back process also involves a significantly isotropic reactive plasma etch, also referred to as a chemical dry etch, that is used to open the gap at the end of the etch back process. The sputter and reactive plasma etches may be performed at least partially at the same time to improve throughput, as long as opening the gap is the last step. The reactive plasma etching can be accomplished with any chemistry that preferentially attacks the etch selectivity layer. For example, $NF_3$ or other fluorine-based chemistry may be used. Some bias may be applied to the wafer. If bias is used, then the reactive plasma etch may not be fully isotropic. For example, a reactive plasma etch for a period of about 5-60 seconds may be suitable.

In one aspect, the invention pertains to a method of filling high aspect-ratio gaps on a semiconductor substrate. The method involves partially filling a gap on a semiconductor substrate with dielectric using a high density plasma chemical vapor deposition (HDP CVD) process. The partial filling creates top hats on the pad next to the gap opening and overhangs that restrict the gap opening in the entry to the gap. Before the gap opening is closed by the overhangs, an etch selectivity layer is deposited to completely close, or to partially plug, the gap opening. Then the dielectric top hats are reduced by sputter etch. The sputter etch removes more material from inclined surfaces (such as the top hats) than on flat, open areas (such as the etch selectivity layer). After the top hats have been reduced, then the etch selectivity layer is removed by substantially isotropic chemical dry etching. Chemical etching may be accomplished with $NF_3$, HF, $F_2$ or $CF_4$, for example. A chemically-reactive plasma may be struck by a radio frequency (RF), microwave, alternating current (AC) or direct current (DC) generator. After the etch selectivity layer material is removed, then the process may repeat until the gap is completely filled with the desired dielectric.

In another aspect, the invention pertains to a method of protecting a bottom portion of a partially-filled gap on a semiconductor substrate. The method involves depositing a small amount of an etch selectivity layer at the bottom of the gap to protect the partially filled dielectric material from being removed by subsequent etch back procedures. The etch selectivity layer may be removed by plasma etch processes before subsequent dielectric deposition.

These and other features and advantages of the present invention are described below where reference to the drawings is made.

DETAILED DESCRIPTION OF THE PRESENT INVENTION

Figure 1A:
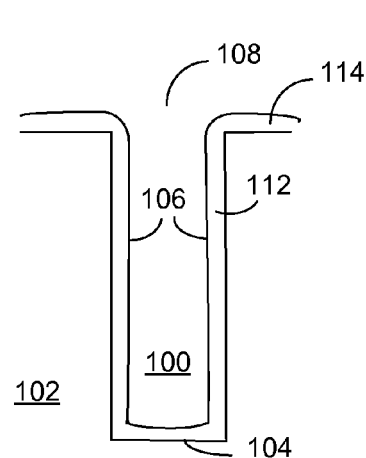
FIGS. 1A-F depict rough schematic cross-sectional diagrams of a multi-step gap fill process in accordance with the present invention.

In the following detailed description of the present invention, a number of specific embodiments are set forth in order to provide a thorough understanding of the invention. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In some descriptions herein, well-known processes, procedures, and components have not been described in detail so as not to unnecessarily obscure aspects of the present invention. For example, the present invention applies to a substrate having gaps in need of being filled by dielectric material. The invention is not, however, limited to such applications. It may be employed in a myriad of other fabrication processes such as for fabricating flat panel displays.

In this application, the terms "wafer" and "substrate"; terms "substrate support" and "pedestal"; and terms "gap" and "trench" will be used interchangeably. The following detailed description assumes the invention is implemented on a wafer. However, the invention is not so limited. The work piece may be of various shapes, sizes, and materials. In addition to semiconductor wafers, other work pieces that may take advantage of this invention include various articles such as display backplanes, printed circuit boards and the like.

Introduction

This invention finds particular value in integrated circuit fabrication. The gap filling processes are performed on partially fabricated integrated circuits employing semiconductor substrates. In specific examples, the gap filling processes of this invention are employed to form shallow trench isolation (STI), intermetal dielectric (IMD) layers, interlayer dielectric (ILD) layers, pre-metal dielectric (PMD) layers, passivation layers, etc.

The present invention relates to a multi-step process comprising high density plasma chemical vapor deposition (HDP CVD) of a dielectric layer, HDP CVD of an etch selectivity layer, and subsequent etch back. The process can fill high aspect ratio (typically at least 6:1, for example 7:1 or higher), narrow width (typically sub 0.13 micron, for example 0.1 micron or less) gaps with significantly reduced incidence of voids or weak spots. This dielectric deposition part of the process may involve the use of any suitable HDP CVD chemistry, including those with hydrogen and dopant precursors in the reactive mixture. The dielectrics employed to fill those gaps will often be a silicon oxide such as silicon dioxide, silicon oxynitride, silicon oxyfluoride, and doped variants of each of these. Therefore, the scope of the invention includes at least phosphorus-doped, boron-doped, fluorine-doped, carbon-doped and any combination of the above. As indicated, the dielectric may also be a boron- and phosphorus-silicon oxide glass (BPSG). Generally, a high density plasma is any plasma having a high concentration of free electrons and, hence, a high concentration of ions. A typical electron density in a high density plasma is in the range of $1 \times 10^{12}$ electron per cubic centimeter or higher. Typically, though not necessarily, high density plasma reactors operate at relatively low pressures, in the range of 100 mTorr or lower.

The etch selectivity layer deposition part of the process involves depositing a layer to partially plug or completely close the gap opening to protect the dielectric deposition in the bottom of the gap. The etch selectivity layer should be deposited before the dielectric overhang significantly closes the gap opening. An appropriate etch selectivity layer material is chosen based on two etch selectivity considerations: the etch selectivity material must be at least as resistant to sputter etch as the dielectric material, but easier to chemically dry etch than the dielectric material with the appropriate etch chemistry. An appropriate etch selectivity layer material may be silicon rich oxide (SRO), silicon nitride, amorphous silicon, or a combination of these materials.

The etch back part of the process involves an integrated multi-step (for example, two-step) procedure including a significantly anisotropic sputter etch followed by a significantly isotropic reactive plasma etch or chemical dry etch. The sputter and reactive plasma etches may be performed at least partially at the same time to improve throughput, as long as opening the gap is the last step. This etch back part of the process may involve a sputter etch using significantly anisotropic process conditions performed simultaneously with or followed by a reactive plasma etch. The reactive plasma etch may comprise a high density plasma or a downstream plasma, powered by, for example, microwave or radio frequency (RF) energy. Suitable plasma reactors with in-situ and/or downstream plasma sources are available to accomplish both of these etch techniques.

This multi-step process sequence of dielectric deposition, etch selectivity layer deposition and etch back may repeated multiple times to achieve a fully-filled structure. All of the methods of the present invention may be performed in a single semiconductor processing tool consisting of single or multiple modules. A single module may consist of a single station, or multiple stations dedicated to different steps of the process. Integrating all the steps in the same tool increases throughput and reduces handling of wafers resulting in more efficient and higher quality gap fill operations.

Multi-Step Deposition and Etch Back Process

FIGS. 1A-F depict rough schematic cross-sectional diagrams of a multi-step deposition and etch back gap fill process in accordance with the present invention. FIG. 1A depicts a gap (trench) 100 on a semiconductor substrate 102 requiring filling with a dielectric. The gap may be defined by its features, namely its bottom 104, sidewalls 106 and entry region (top) 108. The gap 100 is generally lined with a barrier layer, such as silicon nitride. As such, a thin layer (e.g., 10-200 Å, for example 100 Å) of silicon nitride (112) is formed on the gap bottom 104 and sidewalls 106 prior to being filled with dielectric. A pad 114 exists next to the entry region 108, on the substrate surface surrounding the gap 100, and is also generally lined with the same barrier layer.

The present invention, while applicable to the filling of any gap requiring dielectric material, is particularly suited to gap fill of high aspect ratio, narrow width gaps. For example, the gap 100 may have a high aspect ratio, for example about 6:1 or higher and a narrow width, for example about 90 nm or less.

Figure 1B:
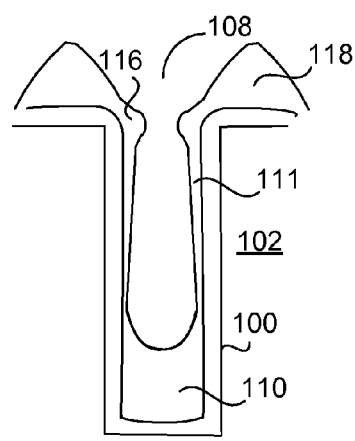

In an initial step in a multi-step gap fill process in accordance with the present invention, the gap 100 is partially filled with a dielectric 110, 111 deposited by a high density plasma (HDP) chemical vapor deposition (CVD) process, as shown in FIG. 1B. The HDP CVD deposition performs bottom-up filling of the trench resulting in a thicker film on the bottom 104 than on the sidewall 111. However, as described above, there is some problematic deposition resulting in an overhang 116 at the entry region 108 of the gap 100 that further narrows access to the gap. Also, a top hat formation 118 forms on top of the pad on the surface adjacent to the gap opening. As noted above, the overhang results from the non-directional deposition reactions of neutral species in the plasma reactor and from sputtering/redeposition processes. Limitations due to overhang formation become ever more severe as the width of the gap to be filled decreases, the aspect ratio increases, and the features become reentrant.

Any suitable dielectric deposition chemistry may be used. The deposition chemistry will have a particular composition depending on flow rates of the constituent gases, process pressures, and volume of the reactor. In general, an HDP CVD process gas will include a precursor for the deposition layer. If the dielectric is a silicon-containing dielectric, then the process gas will include a silicon-containing compound such as silane, disilane, or other silicon precursor described below. The process gas will also generally include a carrier gas. The carrier gas may be an inert gas, such as helium, argon, and/or other noble gases. Or the carrier gas may be or include elemental or molecular hydrogen or deuterium. Oxygen used to react with the silicon-containing precursor or other dielectric precursor may be provided by the precursor itself or from another process gas such as elemental oxygen ($O_2$), nitric oxide (NO), nitrous oxide ($N_2O$), steam ($H_2O$), ozone ($O_3$) and/or peroxides like hydrogen peroxide ($H_2O_2$).

The process gas will include a precursor for the dielectric layer. If the dielectric is a silicon-containing dielectric, then the process gas will include a silicon-bearing compound such as $SiH_4$, $SiF_4$, $Si_2H_6$, TEOS (tetraethyl orthosilicate), TES (Tri-ethoxy Silane), TMCTS (tetramethyl-cyclotetrasiloxane), OMCTS (octamethyl-cyclotetrasiloxane), methyl-silane, dimethyl-silane, 3MS (trimethylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof. During the deposition process the silicon-containing reactant is decomposed to result in a silicon-containing film and volatile by-products.

Oxygen to form the silicon oxide or other dielectric material may be provided by the silicon-containing precursor itself or from another process gas such as elemental oxygen ($O_2$), nitric oxide (NO), nitrous oxide ($N_2O$), steam ($H_2O$), ozone ($O_3$) and/or peroxides like hydrogen peroxide ($H_2O_2$)

Typical flow rate ranges for deposition process gases of the present invention are listed below in units of standard cubic centimeter per minute (sccm).

| Gas | Flow Rate (sccm) |
| --- | --- |
| $SiH_4$ | 2-300 |
| $O_2$ | 5-1000 |
| He | 0-500 |
| $H_2$ | 0-5000 |

Generally, other oxygen and silicon-containing compounds can be substituted for those listed in this table. Depending upon the atom counts in the precursor gases, the flow rate ranges may be changed. While there are no precise rules for modifying flow rates as a function of molecular structure, as an approximation the flow rate of the silicon-containing precursor may be reduced by a factor corresponding to the number of silicon atoms in the molecule. So, for example, if the molecule contains two silicon atoms, one may expect to reduce the flow rate of the silicon-containing precursor to a level of between about 1 and 150 sccm.

Note also that the presence of hydrogen in the process gas may require that the ratio of oxygen-containing precursor to silicon-containing precursor be adjusted upward (in comparison to a hydrogen-free process), as hydrogen reacts with and removes the oxygen from the deposition reaction. Regardless of this process variation, it has been found that the presence of hydrogen in the process gas does not detrimentally affect the physical and material properties of the deposited dielectric film.

In preferred embodiments, the flow rate of hydrogen employed is at least about 100 sccm, and more preferably at least about 400 sccm, and most preferably at least about 500 sccm—all based on a 200 millimeter substrate. Larger substrates require higher flow rates. The flow rate may vary somewhat when special gas injector configurations are employed.

The invention is also practiced with process gases containing noble gas (e.g., argon, neon, helium, or xenon), with helium being preferred, either as the sole carrier gas, or in a mixture with hydrogen or other gases. The use of noble gases can be practiced under the conditions of the above-described embodiments, and their flow rate can be varied to modify the properties of the deposited dielectric film and to modulate the effect of other process gas components (e.g., hydrogen) on the deposition process.

For doped dielectrics (particularly silicon dioxide based dielectrics), the process gas may include a dopant precursor such as a boron-containing gas, a phosphorus-containing gas, a fluorine-containing gas, a carbon-containing gas, or a mixture thereof. In a specific embodiment, the gas includes one or more boron-containing reactants and one or more phosphorus-containing reactants and the dielectric film includes a boron- and phosphorous-doped silicon oxide glass (BPSG). Examples of suitable boron and phosphorus precursor gases include the following: diborane ($B_2H_6$) and phosphine ($PH_3$).

If the dielectric is to contain an oxyfluoride (e.g., silicon oxyfluoride), then the process gas preferably includes a fluorine-containing reactant such as silicon hexafluoride ($SiF_4$) or nitrogen trifluoride ($NF_3$). If the dielectric is to contain an oxynitride (e.g., silicon oxynitride), then the process gas preferably includes a nitrogen-containing reactant such as nitrogen ($N_2$), ammonia ($NH_3$), nitrogen trifluoride ($NF_3$), nitric oxide (NO), nitrous oxide ($N_2O$), and mixtures thereof.

The method applies as well to the deposition (biased or unbiased) of carbon-doped silicon oxide from process gas mixtures including organosilanes (e.g., TEOS (tetraethyl orthosilicate), TES(Tri-ethoxy Silane) TMCTS (tetramethyl-cyclotetrasiloxane), OMCTS (octamethyl-cyclotetrasiloxane), methyl-silane, dimethyl-silane, 3MS (trimethylsilane), 4MS (tetramethylsilane), TMDSO (tetramethyl-disiloxane), TMDDSO (tetramethyl-diethoxyl-disiloxane), DMDMS (dimethyl-dimethoxyl-silane) and mixtures thereof.

During deposition, reactor pressure is held at a value necessary to sustain the optimum high-density plasma. Preferably the process vessel is maintained at a pressure of at most about 100 mTorr. In some cases, the process chamber pressure is maintained below 1 mTorr. For many applications, however, the pressure is maintained between about 1 and 100 mTorr; most preferably between about 1 and 30 mTorr.

The temperature within the process vessel should be maintained sufficiently high to ensure that the dielectric deposition reaction proceeds efficiently. Hence, the temperature preferably resides at values between about 30 and 1000° C. This temperature will vary depending upon the types of precursors employed in the reaction. Further, the temperature may be limited by process constraints, such as thermal budget limitations that preclude temperatures above 700-750° C. Such constraints become increasingly common with advanced technologies and corresponding smaller feature sizes. For such applications, the process temperature is preferably maintained between about 30 and 750° C. In particularly preferred embodiments, the substrate temperature is maintained between about 300 and 600° C., even more preferably between about 350 and 500° C.

As indicated, to control the substrate temperature, the substrate is supported on a substrate holder, or pedestal, that may have temperature control. The temperature control may be in the form of heater elements used to raise the temperature of the substrate and/or in the form of circulating fluid used to remove heat from or redistribute heat across the substrate. The reactor may also supply a heat transfer gas between a surface of the substrate and a surface of the substrate holder on which the substrate is supported during film deposition. The heat transfer gas may include at least one of helium and argon. The back-side helium pressure is set by the temperature requirements of the process (a typical range being between 0-15 Torr).

For some applications, it may be desirable to preheat the wafer to a pre-specified relatively low temperature and then gradually raise the temperature. This allows for isothermal operation. The goal is to start the deposition and then maintain the wafer temperature within a narrow range during the entire deposition process.

The low frequency power applied to the upper electrode(s) (the induction coils for generating the plasma) typically varies from 1 kW to 20 kW, and the high frequency power (for biasing the substrate holder and wafer) typically reaches at least about 0.2 W/cm$^2$ (preferably varying from about 0.5 kW to 10 kW) depending on the substrate size (e.g., 200 or 300 mm diameter) and the requirements of the specific process being used.

As indicated above, the power source applied to the induction coils and the substrate electrode is typically a radio frequency (RF) bias. Applying radio frequency bias to the substrate involves supporting the substrate on a substrate holder having an electrode supplying a radio frequency bias to the substrate. For many embodiments, the radio frequency bias applied to the substrate is at the frequency range of between about 100 kHz and 27 MHz; the RF bias could be operated either in normal or pulse mode, with normal mode being used in the preferred embodiment. The frequency range applied to the induction coils is typically between about 300 kHz and 27 MHz, more typically about 300 kHz and 1 MHz.

In a preferred embodiment, the dielectric deposition process chemistry is as follows:

| Gas | Flow Rate (sccm) |
| --- | --- |
| $SiH_4$ | 100 |
| $H_2$ | 400 |
| $O_2$ | 145 |
| He | 300 |

The low frequency induction coils are powered at 3000 W and the high frequency substrate electrode is powered at 2600 W.

Figure 1C:
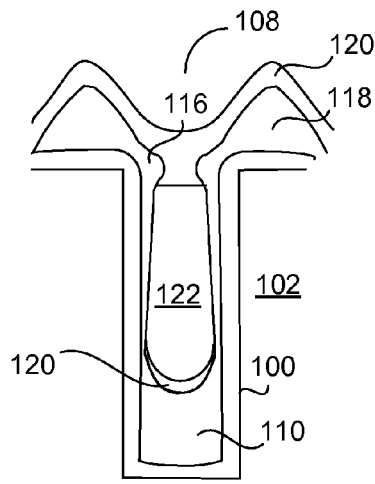

Following the initial deposition of 110, an etch selectivity layer 120 is deposited as shown in FIG. 1C. The etch selectivity layer 120 protects the bottom fill and the nitride barrier liner from being removed by the etch back operation. A portion of the etch selectivity layer deposits onto the bottom of the gap before the gap is partially plugged or entirely closed by extending the overhang to cover the gap opening 108. In some embodiments, the etch selectivity layer is a silicon rich oxide (SRO) layer.

An SRO film is primarily a film that is stoichiometrically deficient in oxygen compared to SiO2. From a chemical bonding standpoint, in bulk SiO2, silicon is bonded to four other oxygen atoms in a network of —[Si—O—Si]—. An individual skilled in the art of SiO2 deposition appreciates the balance of process parameters, namely gas flows, pressure, temperature and/or RF power that need to be maintained in order to obtain stoichiometric SiO2. The stoichiometry of SiO2 is verified through measurement of refractive index (RI) of the film, which should be about 1.46. Typically for a given silicon precursor flow, in this embodiment silane, the oxygen precursor flow needs to be of a certain minimum amount (determined experimentally depending on reactor type, power, pressure and other gases used) to yield films of RI~1.46. In this embodiment an oxygen-deficient environment, obtained by maintaining an oxygen:silane ratio less than 1 to 1.3 produces a SRO film, wherein every silicon atom is connected to less than four other oxygen atoms. This kind of film has a larger percentage of Si—Si bonds than Si—O bonds.

The SRO material may be deposited in a same chamber or different chambers as the HDP CVD dielectric material. The process parameters for SRO deposition is similar to that of the HDP CVD, except that the SRO is deposited in a reduced oxygen environment so that the oxygen:silicon ratio is less than 2:1 in the film. The reactant gas concentrations may have a ratio of about 0.5-1.3 oxygen to silicon, for example. A higher oxygen to silicon ratio may be used if hydrogen is also added, because hydrogen would react with oxygen that would otherwise bond with silicon. A suitable precursor gas may be silane, disilane, silicon tetrafluoride, or a combination of them.

In a preferred embodiment, the SRO deposition process chemistry is as follows:

| Gas | Flow Rate (sccm) |
| --- | --- |
| $SiH_4$ | 100 |
| $H_2$ | 400 |
| $O_2$ | 100 |
| He | 300 |

In this example, the low-frequency induction coils were powered at about 6000 W, and the high-frequency substrate bias power was at about 2000 W.

In addition to SRO, other materials may be used as the etch selectivity layer. Etch selectivity is a value that indicates how much a given etch process might affect the material as compared to another material. A higher value means that the given material is easier to etch under the same conditions. In general, the etch selectivity layer material 120 should have the same or a lower selectivity for physical-sputter etch than the dielectric material 110, but a higher selectivity for the preferred chemical dry etch than the dielectric material 110. Preferably, the suitable etch selectivity layer material can be deposited in the same chamber or in a different chamber on the same semiconductor tool as the dielectric material 110. Depositing the etch selectivity layer material in-situ (on the same tool) would save processing time and reduce chances for contamination. Suitable etch selectivity layer materials include silicon rich oxide (SRO), silicon nitride, amorphous silicon, or a combination of these materials. Methods of depositing these materials are known in the art and are not discussed in detail here.

After the etch selectivity layer deposition, a multi-step etch back process is carried out in the same or a separate reactor chamber with a different operation regime (e.g., a pressure range of 0.002 to 5 torr) than the deposition process. In the first step of the etch back process, the wafer is processed under predominantly anisotropic conditions. A plasma is struck in the chamber using hydrogen, deuterium, helium, nitrogen, argon, oxygen or a combination of these gases to produce ions. A bias is generally applied to the wafer to induce the ions in the plasma to strike the wafer, resulting in material being sputtered from the exposed surfaces. In some embodiments, this etching step occurs for a period of 10-90 seconds. In certain preferred embodiments, this etching step occurs for a period of about 60 seconds.

Figure 1D:
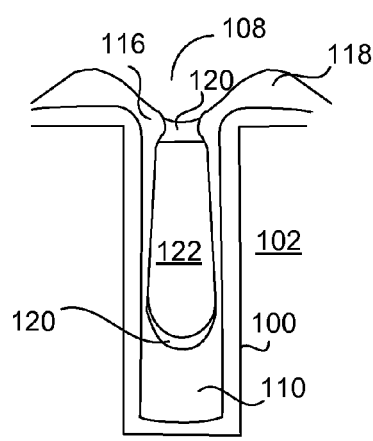

In this step, the etching removes the etch selectivity layer 120 on top of the top hats 118 and a portion of the dielectric material comprising the top hats 118, as shown in FIG. 1D. This sputter etch step removes some of the etch selectivity layer 120 in the entry to the gap 108 but preferentially does not open the gap at 108. Not all of the etch selectivity layer 120 is removed so that the gap remains partially plugged or fully closed.

This sputter etch step removes more material from the top hats than the plug area. The sputter etch rate as a function of ion angle of incidence is highest at about 45 degrees, thus the sputter etch rate is higher on inclined surfaces such as the top hats than on flat, open areas such as that above the etch selectivity layer plug.

The material ejected from the surface by the sputtering may redeposit on other surfaces of the structure. This process results in growth of overhangs at the entry to the gap during deposition, as described earlier. During this sputter etch step, the etch selectivity layer plug 120 prevents redeposition from occurring in the gap interior 122. If the entry to the gap opens significantly during the sputter etch step, materials from etch back operations can enter the gap and redeposit on the sidewalls, forming unfavorable sidewall profiles. This redeposition material generally has greater disorder, lower density, and poorer interfaces than the initial deposition material and results in weak spots and voids with the dielectric gapfill. Therefore, by reducing the top hats 118 without significantly opening the gap at 108, the problems caused by redeposition materials in the gap are avoided.

The entry to the gap 108 does not have to be entirely closed to prevent ions or redeposition materials from reaching the interior of the gap 122. Depending on the ion angle of incidence, a partial plug may still shadow the entry to the gap to prevent or significantly reduce the number of ions and sputtered materials able to pass through the reduced entry to the gap.

In a specific embodiment, the first sputter etch step is a primarily anisotropic process that utilizes slightly higher process pressures and lower process power than the deposition process. For example, a sputter etch process with reduced low-frequency induction coil power (e.g., about 100 to 4000 W, for example, 2500 W), high-frequency substrate bias of about 500 to 7000 W, a process pressure of about 2-800 mTorr may be used. While helium chemistry is preferred in one embodiment of the invention, the sputter etch step can be realized using other gases (e.g., $H_2$, $D_2$, Ar, $N_2$, $O_2$,). Typical process parameter ranges for the sputter etch process of the present invention are listed below for an $H_2$/He-based chemistry.

| He (sccm) | 50-1000 |
| --- | --- |
| Oxygen | 5-400 |
| H2 | 5-2000 |
| Pressure (mTorr) | 2-800 |
| Source (LF RF) Power (W) | 100-10000 |
| Bias (HF RF) Power (W) | 0-10000 |
| Pedestal Temperature (C) | 20-500 |
| Time (s) | 1-120 |

In a preferred embodiment, the sputter etch process chemistry is as follows:

| He (sccm) | 300 |
| --- | --- |
| Oxygen | 145 |
| $H_2$ | 400 |
| Pressure (mTorr) | 2-15 |
| Source (LF RF) Power (W) | 6000 |
| Bias (HF RF) Power (W) | 4500 |
| Time (s) | 40 |

Figure 1E:
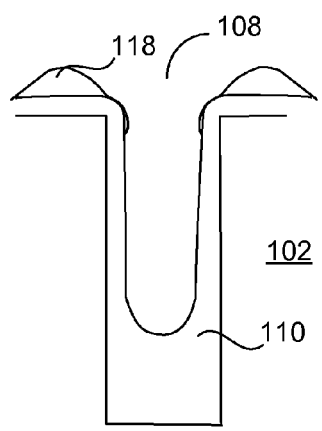

In the next step of the etch back process, the wafer is processed under isotropic, anisotropic, or a combination of both etch conditions using reactive chemistry. For example, the wafer is exposed to a downstream plasma or inductively-coupled plasma containing reactive chemistries chosen for higher etch rates of the etch selectivity layer than of the dielectric material. This step removes the remaining etch selectivity layer plug 120 in the entry to the gap 120 without removing too much of the dielectric material from the corners of the gap, preventing the underlying barrier liner 112 from being exposed. It also removes the etch selectivity layer from the bottom of the gap, exposing the dielectric material. It does remove some of the dielectric material from the overhangs at the entry to the gap 116 and from the bottom of the gap 110, however, this removal rate is controlled by the etch selectivity ratio of the chosen etch chemistry. This reactive plasma etch step results in widening of the gap and reduction in top-hat 118, thus reducing the aspect ratio of the partially filled gap, as illustrated in FIG. 1E, and facilitating further filling of the gap by subsequent HDP CVD dielectric deposition.

In some embodiments the second etch step is a reactive plasma etch process that utilizes fluorine-based chemistry. This reactive plasma etch is generally performed at different process conditions that the sputter etch. For example, an inductively-coupled plasma (ICP) configured reactor with up to 10 KW of delivered source power (e.g., about 2000 to 7000 W, for example, 3000 W), a biased and/or unbiased substrate holder, a process pressure of about 5-100 mTorr and a fluorine-based chemistry (e.g. $NF_3$) may be used. While He/$NF_3$-based chemistry is preferred in one embodiment of the invention, the etch step can be realized using other fluorine-containing compounds (e.g., $F_2$, HF, $C_2F_6$, $CF_4$, $SF_6$, etc) and carrier gases (e.g., Ar, He, $H_2$, $D_2$, $N_2$). Typical process parameter ranges for ICP etch process gases in accordance with the present invention and reactor conditions are listed below.

| $NF_3$ (sccm) | 5-5000 |
| --- | --- |
| He (sccm) | 0-5000 |
| $H_2$ | 0-2000 |
| Pressure (mTorr) | 5-100 |
| Source Power (W) | 1000-10000 |
| Bias Power (W) | 0-5000 |
| Time (s) | 1-120 |

In a preferred embodiment, the fluorine-based etch process chemistry is as follows:

| $NF_3$ (sccm) | 100 |
| --- | --- |
| He (sccm) | 500 |
| $H_2$ (sccm) | 1000 |
| Pressure (Torr) | 12 |
| Source Power (W) | 3000 |
| Bias Power (W) | 500 |
| Time (s) | 8 |

The conditions are preferably set so that the primarily isotropic etch has higher selectivity to the etch selectivity layer (for example, SRO) relative to the HDP CVD deposited dielectric (e.g., $SiO_2$). It should also have higher selectivity for the HDP CVD deposited dielectric relative to the silicon nitride barrier layer lining the trench. One skilled in the art would be able to adjust the process selectivity given the etch chemistry, process parameters and description provided herein. The process selectivity can be controlled in the range of 16:4:1 to 1.2:1.1:1.0, more typically about 3:1.5:1 (SRO: USG: silicon nitride).

The second step of the multi-step dry etch process, shown in FIG. 1E, removes some of the remaining dielectric top hats, all of the etch selectivity layer forming the plug, some dielectric from sidewalls, and all of the etch selectivity layer in the bottom of the gap. The primarily isotropic reactive plasma etch removes materials from all surfaces. Preferably, all or most of the dielectric material is removed from the sidewalls and top hats without etching any of the underlying barrier liner (e.g. silicon nitride). More commonly, some HDP CVD dielectric will remain as the top hat 118 and overhang, as shown in FIG. 1E. The etch selectivity layer 120 at the bottom of the gap protects the dielectric gap fill 110 from significant removal by the etch process, which would be counter-productive for the gap fill operation. One skilled in the art would be able to adjust the process parameters such that only the etch selectivity layer is removed from the bottom of the gap in this step. After all the etch selectivity layer is removed and the gap is widened, subsequent deposition would be able to fill the gap from the bottom up in the next HDP deposition step. Note that all of the etch selectivity layer should ideally be removed before subsequent HDP deposition. Incorporating some etch selectivity layer material in the final gap fill is undesirable, because it can be a source of defects and can negatively affect device performance.

In some embodiments, more than two etch back steps may be used. At least one sputter etch step will always proceed at least one reactive plasma etch step, with primarily anisotropic sputter etch step(s) used to reduce the top hat formations and primarily isotropic reactive plasma etch step(s) used to remove the etch selectivity layer and open the gap. In certain embodiments, it may be advantageous to use a first aggressive sputter etch step to quickly etch the top hat formations, followed by a second milder sputter etch step to remove more of the top hats without significantly removing the etch selectivity plug. The third reactive plasma etch step will then remove all of the etch selectivity layer material and some more of the dielectric material. In another embodiment, a first sputter etch step may be followed by a second reactive plasma etch step using chemistry and process conditions chosen for a higher etch rate of the etch selectivity material (e.g. SRO) to the dielectric material (e.g. $SiO_2$). However, this reactive plasma etch may be stopped before all of the etch selectivity layer is removed and different reactive plasma chemistry and process conditions may be used to complete the final removal. This third reactive plasma etch process may be designed to have a higher etch rate of the dielectric material (e.g. $SiO_2$) to the underlying barrier liner material (e.g. SiN).

Figure 1F:
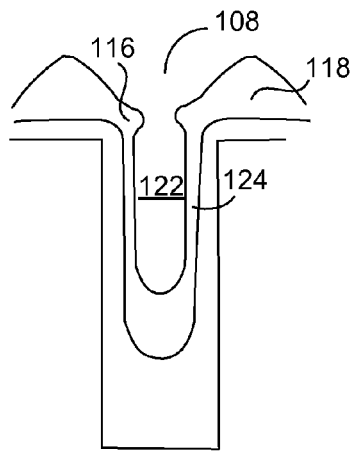

Following the multi-step etch back process, an additional HDP CVD deposition is performed in order to further fill the remaining gap 122 with dielectric 124, as shown in FIG. 1F. The dielectric 124 forms overhangs 116 and top hats 118. The deposition of an etch selectivity layer, etch back and deposition steps depicted in FIGS. 1C-F are then repeated until the gap is filled. For a gap with about a 6:1 aspect ratio and about a 1000 Å width, three to five, for example four, iterations of the etch back and deposition steps are typical to obtain void-free filling of the gap.

Implementation: Plasma Processing Systems

Figure 2:
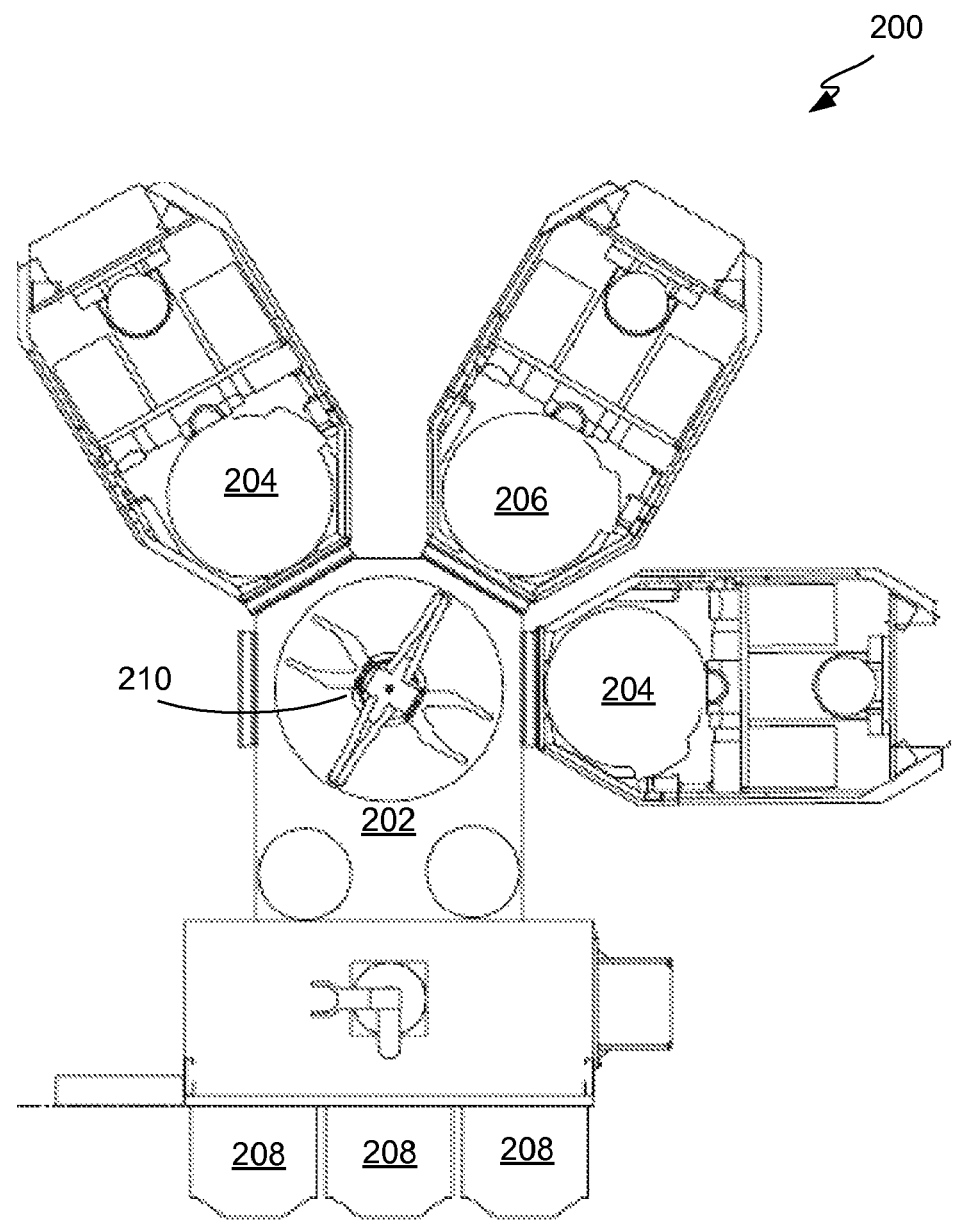
FIG. 2 is a block diagram of a plasma processing system suitable for conducting a multi-step gap fill process in accordance with the present invention.

FIG. 2 is a block diagram of a plasma processing system suitable for conducting a multi-step gap fill process in accordance with the present invention on semiconductor wafers. The system 200 includes a transfer module 202, such as the wafer transfer system (WTS) used on the Speed platform available from Novellus Systems, Inc. of San Jose, Calif. The transfer module 202 provides a clean, pressurized environment to minimize the risk of contamination of substrates being processed as they are moved between the various processing stages. Mounted on the transfer module 202 are one or more (in this case two) HDP CVD modules 204, such as Novellus SPEED reactors, available from Novellus Systems, Inc. or the Ultima reactors, available from Applied Materials, Inc. of Santa Clara, Calif., and one or more (in this case one) plasma etch module 206, such as a Novellus SPEED reactor, Novellus PEP IRIDIA DL strip and clean plasma reactor, Novellus INOVA xT preclean reactor, Novellus atomic layer removal (ALR) reactor, Applied Materials Centura etch reactor, or Applied Materials Producer etch reactor. The system 200 also includes one or more (in this case three) wafer source modules 208 where wafers are stored before and after processing. A device (generally a robot arm unit) 210 in the transfer module 202 moves the wafers among the modules mounted on the transfer module 202.

Briefly, wafers are transferred by the robot arm 210 between the HDP CVD reactors 204 and/or the plasma etch reactor 206 for deposition and etch back processing, respectively. In one embodiment, a single etch reactor can support two SPEED deposition modules in this application with a high throughput of about 15-16 wafers per hour (wph). In other embodiments, two etch reactors 206 would support one or more SPEED deposition modules.

It should also be understood that, in the preferred embodiment, the present invention may also be practiced in a single chamber equipped for both plasma deposition and multi-step sputter and reactive plasma etch. For example, the Novellus SPEED HDP-CVD reactors are capable of deposition and multi-step plasma etch in accordance with the present invention with a throughput similar to that of using separate reactors. Given the details and parameters provided herein, one of skill in the art would know how to configure a single chamber, for example, a plasma reactor, with equipment, for example the various plasma sources described herein, for deposition (HDP CVD), sputter etch (e.g., RF source) and reactive plasma etch (e.g., in-situ or downstream plasma source).

The foregoing describes implementation of the present invention in a single or multi-chamber semiconductor processing tool, capable of performing both deposition and etch processes sequentially.

Process

Figure 3:
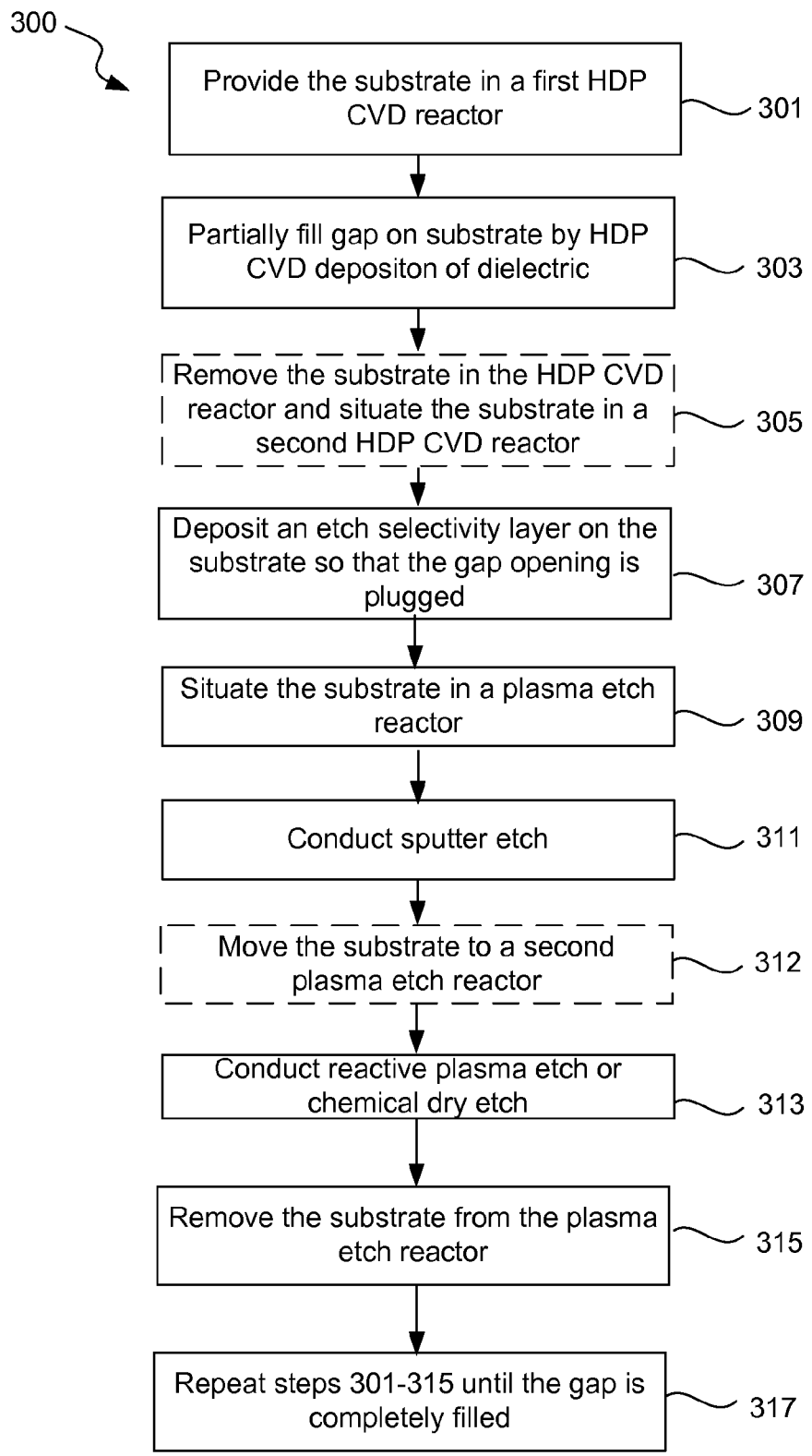
FIG. 3 is a process flow diagram depicting a process context of the present invention.

FIG. 3 is a process flow diagram (300) depicting a process context of the present invention. A substrate with a feature requiring gapfill, such as a semiconductor wafer with a high-aspect-ratio trench, is situated in an HDP CVD reactor (301).

A deposition process begins with generation of a high density plasma in the chamber, given preferred RF source power, RF bias power, process gas concentration and flow rates, reactor pressure, substrate pedestal temperature and other process parameters. Providing the substrate to the reactor may involve clamping the substrate to a pedestal or other support in the chamber. For this purpose, an electrostatic or mechanical chuck may be employed.

After the wafer is appropriately situated in the chamber, a gap on the substrate is partially filled by HDP CVD deposition of dielectric (303). Several operations are typically performed in the deposition reactor as part of this dielectric deposition process. Generally, the process provides a pre-clean operation. This is intended to remove polymer or other residues in the gap prior to deposition of the dielectric film. Preferably, this is accomplished with a plasma phase reaction of at least one of an oxygen-containing gas and a hydrogen-containing gas. Oxygen is used for species that require oxidation and hydrogen is used for species that require reduction. After the substrate has been appropriately cleaned, various other operations associated with dielectric deposition are performed. These operations may be performed sequentially in the order described or in some other order. In addition, some or all of these operations may be performed concurrently, as they are implemented by different subsystems of the reactor.

The process adjusts the substrate temperature to a level promoting the deposition of the dielectric layer. Typically, this temperature is between about 30-1000° C. (more preferably about 300 to 680° C., for example 350-550° C.). The temperature control mechanism may gradually raise the temperature during deposition or it may preheat the wafer to first drive out certain interfering species. During deposition, the temperature may be maintained by supplying a heat transfer gas between a back surface of the substrate and a surface of the substrate holder on which the substrate is supported during the film growth operation. The temperature may be varied during deposition. The temperature control mechanism may gradually lower the temperature prior to or after completion of the deposition.

The process adjusts the pressure of the process chamber to a level suitable for the HDP CVD reaction. In some specific embodiments, this pressure is not greater than about 100 mTorr. The pressure should allow relatively rapid deposition while maintaining a high density plasma under the applied frequency and power. The pressure may be varied during deposition.

The reactor system introduces a process gas to the reaction chamber via one of more inlets. The process gas includes dielectric precursor species such as high vapor pressure silicon-containing compounds, and optionally one or more dopant precursors, such as the phosphorus precursor phosphine ($PH_3$). Molecular oxygen or another oxygenated compound will often be present. A carrier gas is also generally present. The carrier gas may be an inert carrier gas such as helium. However, in high aspect ratio gap fill applications the carrier gas preferably is or includes molecular or elemental hydrogen. All the process gas components are introduced at specified flow rates in a specified order, which may be simultaneously or sequentially.

An electrical subsystem applies a bias to the substrate, to thereby direct charged precursor species from the plasma onto the substrate and to grow a dielectric film. Note that the substrate itself serves as an electrode here. Its bias accelerates charged species to it. Typically, the substrate electrode is powered by a high frequency RF bias and the source electrode(s) (e.g. induction coils) are powered by a low frequency RF source.

Dielectric is deposited in the gap or gaps on the substrate to a desired thickness, generally before the point where the overhang that forms at the gap entry point prevents further effective filling of the gap (303).

After evacuating the chamber and adjusting the temperature and pressure as appropriate, further processing is performed on the substrate, or the substrate may be removed from the HDP CVD reactor for further processing (305). The substrate with partially filled gap(s) may then be situated in another HDP CVD reactor. For example, the robot arm 210 removes the substrate from an HDP CVD reactor 204 and transfers it to the other HDP CVD reactor 204 for depositing an etch selectivity layer. In the preferred embodiment, step 305 does not occur. The etch selectivity layer may be deposited in the same chamber as the HDP CVD dielectric, but with different process parameters and chemistries.

An etch selectivity layer is deposited on the substrate such that the gap opening is partially plugged or fully closed (307). Note that in step 303, the deposition stops if the overhang that forms at the gap entry point prevents further effective filling of the gap. Although materials will enter the gap as long as the gap is open, the film at the bottom of the gap will not grow smoothly after the opening is significantly reduced. The deposition of the etch selectivity layer would continue growth of the overhang such that the gap is significantly or completely plugged. Of course, the etch selectivity material will also enter the gap before it closes to protect the dielectric material on the bottom of the gap from subsequent chemical etching.

The process for depositing the etch selectivity layer is similar to that of the HDP CVD dielectric. First, a plasma may be used to treat the surface of the substrate in a preclean operation. In preferred embodiments, preclean operation does not occur, especially when the substrate stays within the same reactor or in the same tool. The substrate temperature and chamber pressure are maintained at a suitable level for etch selectivity layer deposition. Typically, this temperature is between about 30-1000° C. (more preferably about 300 to 680° C., for example 350-550° C.). This pressure may be less than about 100 mTorr. The temperature and pressure control mechanisms are the same as that during the HDP CVD dielectric deposition process.

The reactor system then introduces a process gas to the chamber. The process gas may include reactants and carrier gas. Depending on the material chosen for the etch selectivity layer, different reactants and combinations may be used. For example, to deposit silicon rich oxide (SRO), the reactant gases may be silane and oxygen. The reactant gas concentrations may have a ratio of about 0.5-1.3 oxygen to silicon to ensure the correct structure is formed in the film.

In some embodiments, no bias is applied to the substrate support during the etch selectivity layer deposition. In other embodiments, substrate bias may be modulated. Some bias may be applied initially to induce reactant ions to deposit at the bottom of the gap. After a layer of material adequate to protect the bottom fill from subsequent chemical etching is formed, then the bias to the substrate support may be reduced or stopped to grow the overhang so the gap opening becomes plugged. The bias may also be pulsed during deposition of the dielectric material and the etch selectivity material.

When a sufficient amount of etch selectivity layer is deposited, typically about 10~500 angstroms, preferably about 10~50 angstroms, depending on the top hat thickness and the etch selectivity, the substrate is subjected to the etch back steps in the same chamber or may be removed from the deposition reactor into a plasma reactor. Alternatively, one plasma reactor may be used for one of the etch back steps and another plasma reactor used for another etch back step.

As noted above, a multi-step etch back process in accordance with the present invention is preferably implemented in a single plasma reactor, which is the same reactor for every operation including deposition and etch back. An etch back process begins with a sputter etch (311). In a preferred embodiment, the anisotropic etch is conducted using the RF source of a dual source reactor. An electrical subsystem applies electrical energy of appropriate power to one or more electrodes of a process chamber of the reactor. The power and frequency are chosen to generate a sputter etch plasma in the chamber, given the etchant chemistry, pressure, and other process parameters. Providing the substrate to the reactor may involve, but not require clamping the substrate to a pedestal or other support in the chamber. For this purpose, an electrostatic or mechanical chuck may be employed.

After the wafer is appropriately situated in the chamber, the process adjusts the substrate temperature to a level promoting the removal of the top hats situated on top of the pad barrier layer (e.g. SiN). Typically, this temperature is between about 10-200° C. (more preferably about 10 to 100° C., for example 20° C.). The process also adjusts the pressure of the process chamber to a level suitable for sputter etch. This pressure is generally about 2-800 mTorr.

The reactor system introduces etch gases to the reaction chamber via a one or more inlets. The etchant process gases should dissociate quickly in the plasma (for optimum directionality) and provide for a volatile etch by-product that can be removed from the system without redeposition on the substrate. Hydrogen, deuterium, helium, nitrogen, argon, or a combination of these gases may be used.

Generally, an electrical subsystem applies an RF bias to the substrate, to thereby direct charged precursor species from the plasma onto the substrate and etch the dielectric film. Note that the substrate itself serves as an electrode here. Its bias accelerates appropriately charged species to it. Typically, the substrate electrode is powered by a high frequency RF source. This etch step removes material by physical sputter and does not rely on any chemical reaction between the etchant and the dielectric material.

The process substantially anisotropically etches dielectric and removes a portion of the etch selectivity layer and the HDP CVD dielectric from the top hat formations, on top of the pad nitride, without opening the entry to the gap (311). As explained above, the geometries of the top hats and the plug area favors etching of the top hat formations.

After the first etch step is complete, the reactor chamber conditions are readjusted for the second, primarily isotropic etch step (313). In a preferred embodiment, the reactive plasma etch is conducted using the same reactor. The substrate temperature adjusts to a level promoting the removal of the etch selectivity layer plug and some of the dielectric from the sidewalls. Typically, this temperature is between about 10 and 500° C. (more preferably about 10 to 100° C., for example 20° C.). The process also adjusts the pressure of the process chamber to a level suitable for chemically reactive plasma. This pressure is generally about 5 mTorr to 5 Torr, depending on the type of plasma used.

In one embodiment, an HDP CVD reactor is used for the reactive plasma etch step. It may be the same or a different reactor than the one used for deposition or for the sputter etch step. If a different reactor is used, then the substrate is moved to a second plasma etch reactor 312 for the reactive plasma etch.

In another embodiment, a dual-source reactor equipped with a downstream plasma source is used for this etch back step. The downstream plasma may be powered by an RF or microwave source. In a preferred embodiment, an electrical subsystem applies electrical energy of appropriate power and frequency to the microwave source of the dual-source reactor. The power and frequency are chosen to generate an ICP plasma in the plasma chamber, given the etchant chemistry, pressure, and other process parameters.

The HDP CVD or the dual-source reactor system introduces the etchant chemistry to the reaction chamber via a one or more inlets. The etchant process gas should dissociate at a controlled rate consistent with chemical etching and provide for uniform etching of the etch selectivity layer and the dielectric. In a preferred embodiment, a fluorine-based chemistry is used. An $NF_3$/He-based chemistry is typically used. Other fluorinated gases, e.g., $SF_6$ or $CF_4$ may be used. Molecular oxygen and/or one or more carrier gases such as hydrogen, deuterium, helium or argon may also be present in the etchant chemistry. All the process gas components are introduced simultaneously or sequentially at specified flow rates within the parameters noted above.

The substrate may be biased or unbiased for the chemical etching process. The plasma source generates a plasma that is then exposed to the substrate. If the substrate is biased, then the operation is not completely isotropic. It should be noted that the chemical etch may be alternatively accomplished by a variety of reactive plasma etches, as described above.

The chemical etch process etches the most of the remaining top hat formations, the etch selectivity layer plug and protective etch selectivity layer in the gap bottom, and most of the sidewall dielectric in the gap(s), thus widening the remaining gap thereby decreasing its aspect ratio and facilitating further filling in subsequent deposition processing (315). The process parameters must be selected such that the gap is widened as much as possible without removing much of the HDP CVD dielectric at the gap bottom. In other words, only the etch selectivity layer should be removed from the gap bottom in this step.

If using a two-step etch process, the etch back is complete following the reactive plasma etch. Other multi-step etch back processes may be used, as described above. The etch back process may consist of two sputter etch steps followed by a single reactive plasma etch. Or the etch back process may consist of one sputter etch step followed by two or more reactive plasma etches. However, it is desired to conduct the complete etch back process in as few steps and in as short a process time as possible to improve the overall wafer throughput of the tool.

After completing the etch back process, the substrate may be subjected to further deposition and etch back in the same chamber or may be removed from the etch reactor and returned to a deposition reactor for further deposition processing (315), if more than one chamber is used. For example, the robot arm 210 removes the substrate from the plasma etch reactor 206 and transfers it to an HDP CVD reactor 204 for another round of dielectric deposition.

The etch back and deposition processes (301-315) are then repeated until the gap is filled. For a gap with about a 6:1 aspect ratio and about a 1000 Å width, three to five, for example four, iterations of the etch back and deposition steps are typical to obtain void free filling of the gap.

Example

The following example is provided to illustrate certain aspects of the present invention. The example will serve to further illustrate the invention but is not meant to limit the scope of the invention in any way.

In this example, one embodiment of the methods discussed herein was practiced on a SPEED semiconductor processing tool from Novellus Systems. First a layer of dielectric was deposited using an HDP CVD reactor onto multiple substrates having gaps. The thickness of the bottom fill, the top hat, and the sidewalls were measured and plotted in FIG. 4 as "Dep." After the initial deposition, the bottom thickness was about 980 angstroms; the top hat, about 1250 angstroms; and the sidewall, about 177 angstroms. The aspect ratio of the remaining gap was measured and shown in FIG. 5. After the initial deposition, the aspect ratio was about 7.8.

After the initial deposition, an SRO etch selectivity layer was deposited onto one of the substrates. The SRO was deposited on top of the HDP CVD dielectric.

The substrate was then subjected to a two-step etch back process. The first step was a biased sputter etch for 60 seconds to reduce the top hats. Helium, oxygen, and hydrogen were injected into the chamber at 300 sccm, 145 sccm, and 400 sccm, respectively. The source power was 6000 W and the bias power was 4500 W. The second step was reactive plasma etching for 11 seconds to clear the SRO plug and the dielectric sidewalls. The etchant used was $NF_3$ (100 sccm). Gases injected include helium (500 sccm) and hydrogen (1000 sccm). The source power was 3000 W. In this step, a bias (500 W) was applied to the substrate. The SRO layer was removed by these etching steps and only the HDP CVD dielectric remained.

Figure 4:
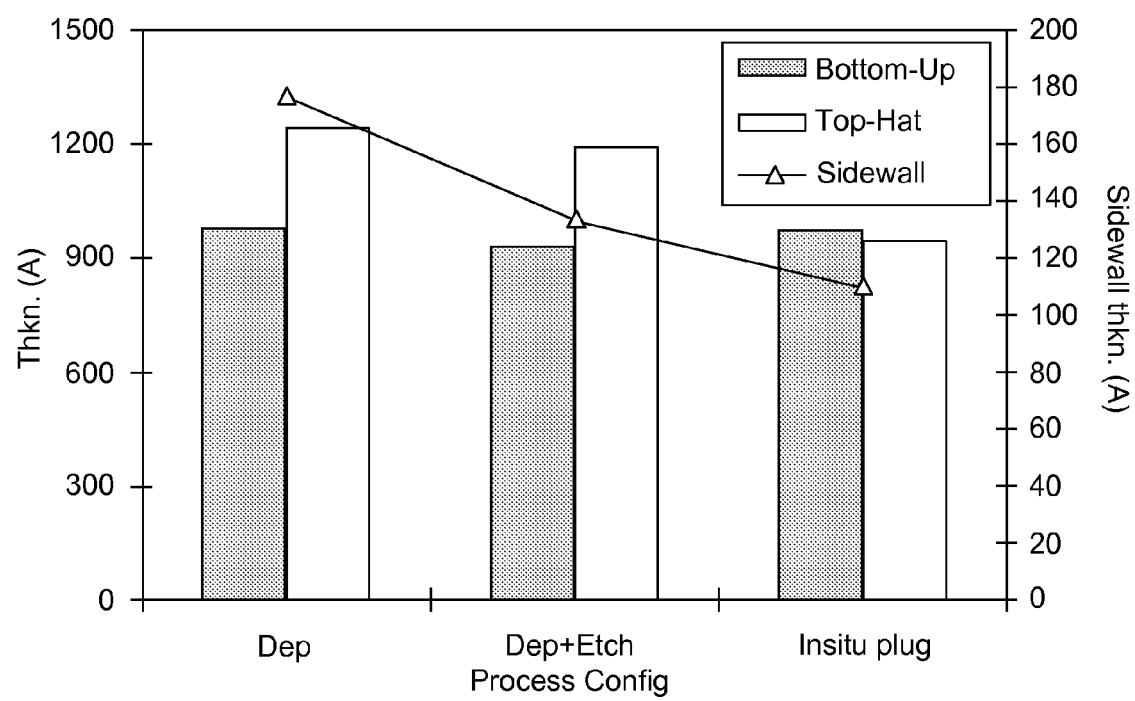
FIG. 4 is a plot of data illustrating the thickness at various points from an example operation of the present invention.
Figure 5:
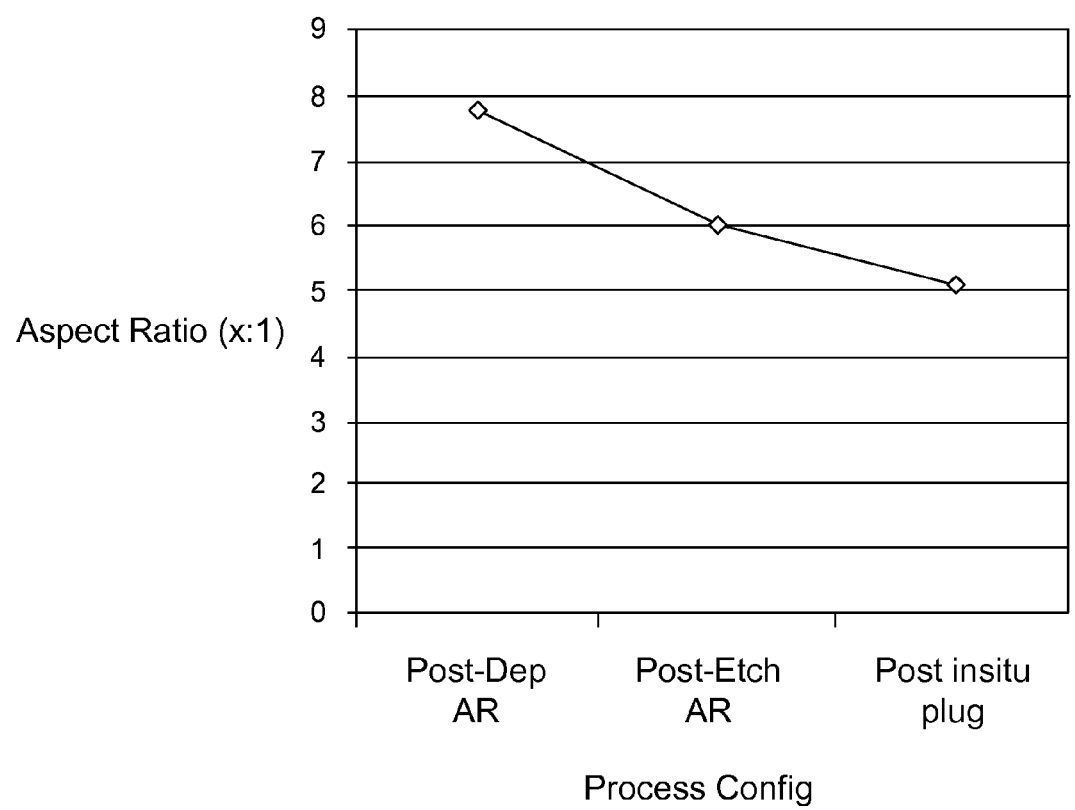
FIG. 5 is a plot of data illustrating the aspect ratio obtained before and after an example operation of the present invention.

After the two-step etch back process, thickness measurements were again taken, as shown on FIG. 4 as "Insitu plug". The bottom thickness was about 980 angstroms; the top hat, about 950 angstroms; and the sidewall, about 110 angstroms. The bottom thickness after etch back was about the same as the bottom thickness after the initial deposition. This shows that the HDP CVD dielectric bottom fill was protected. At the same time, the top hat and sidewall thicknesses were reduced. The aspect-ratio after the etch back process was about 5.2:1 as shown on FIG. 5 as "Post insitu plug," an improvement from that after the initial dielectric deposition.

In addition to performing the methods of the present invention, one or more substrates from the initial deposition were subjected to the conventional etch back process without the in-situ etch selectivity layer plug. The thickness measurements were taken and shown on FIG. 4 as "Dep+Etch Process Config." The aspect-ratio is 6:1, as shown on FIG. 5 as "Post-Etch AR."

The results show that the process using an in-situ etch selectivity layer plug, in accordance with the invention, is an improvement over the conventional etch back process. The bottom thickness is only a little lower for the conventional process, so minimal HDP CVD bottom fill was removed in the etching process. The top hat thickness and sidewall thickness were significantly reduced with the new method. Finally, the aspect ratio obtained by using the etch selectivity layer was 5.2:1 compared to 6:1 for the conventional process.

The results of this example demonstrate that the present invention is a proven way to reduce the aspect ratio of gaps without loss of bottom fill. The present invention offers a way to fill challenging structures that would be difficult to fill by standard HDP CVD dep-etch-dep processes. In some cases, the number of iterations required to fill a particular structure may be reduced because the etch selectivity layer protects the bottom fill from being removed during the etch back process.

While this invention has been described in terms of a few preferred embodiments, it should not be limited to the specifics presented above. Many variations on the above-described preferred embodiments may be employed. Therefore, the invention should be broadly interpreted with reference to the following claims.

What is claimed is:

1. A semiconductor processing method for high-aspect-ratio gapfill, comprising:
   (a) providing a substrate with at least one high-aspect-ratio feature;
   (b) depositing a dielectric layer to partially fill the feature, wherein the depositing stops before a gap opening of the feature closes;
   (c) depositing an etch selectivity layer to at least partially plug the gap opening;
   (d) etching the substrate to reduce the aspect ratio of the feature, wherein the etching comprises a first etch operation and a first etch chemistry, wherein the partially filled feature achieved in operation (b) is substantially protected, and wherein the etching removes the etch selectivity layer in regions surrounding the at least partially plugged gap opening to expose the dielectric layer but does not remove all of the etch selectivity layer of the partially plugged gap opening; and
   (e) etching the substrate to remove the etch selectivity layer from the gap opening and open the feature, wherein the etching comprises a second etch operation and a second etch chemistry, at least one of the first etch operation and the first etch chemistry being different from the second etch operation or the second etch chemistry.

2. The method of claim 1, wherein the first etch operation (d) is sputter etching and the second etch operation (e) is reactive plasma etching.

3. The method of claim 2, wherein either or both of the etch operations comprise one or more etching processes having different process parameters.

4. The method of claim 1, further comprising repeating (b) though (e) until the feature is filled.

5. The method of claim 1, wherein the dielectric layer is silicon oxide.

6. The method of claim 5, wherein the silicon oxide is deposited using a high density plasma process.

7. The method of claim 1, wherein the etch selectivity layer comprises a material selected from the group consisting of silicon rich oxide, silicon nitride, amorphous silicon, and a combination thereof.

8. The method of claim 1, wherein the, etch selectivity layer comprises silicon rich oxide, and wherein the silicon rich oxide thickness is about 10 to 50 angstroms.

9. The method of claim 2, wherein the etch selectivity layer is less susceptible to sputter etching than the dielectric layer.

10. The method of claim 2, wherein the sputter etching is substantially anisotropic.

11. The method of claim 2, wherein the sputter etching does not significantly open the feature.

12. The method of claim 2, wherein the sputter etching is performed with a bias applied to the substrate.

13. The method of claim 2, wherein the sputter etching is performed for 1 to 120 seconds.

14. The method of claim 2, wherein the sputter etching is performed for about 60 seconds.

15. The method of claim 2, wherein the first etch chemistry comprises species selected from the group consisting of hydrogen ions, deuterium ions, helium ions, nitrogen ions, oxygen ions, argon ions, and combinations thereof.

16. The method of claim 2, wherein the second etch chemistry uses $NF_3$, $HF$, $F_2$, $CF_4$, $SF_6$ or other fluorine-based chemistry.

17. The method of claim 2, wherein the reactive plasma etching is substantially isotropic.

18. The method of claim 2, wherein the reactive plasma etching is performed with bias applied to the substrate.

19. The method of claim 2, wherein the reactive plasma etching is performed for 1 to 120 seconds.

20. The method of claim 1, wherein an aspect ratio of the feature is reduced.

21. A method of protecting a bottom portion of a partially filled gap feature partially filled with a material on a semiconductor substrate, comprising:
   (a) providing the substrate with the partially filled gap feature;
   (b) depositing an etch selectivity layer on top of the material partially filling the gap feature; and
   (c) etching the substrate, wherein the etching comprises an etch operation and an etch chemistry, and wherein the etching removes the etch selectivity layer and little or none of a bottom portion of the material partially filling the gap feature.

22. The method of claim 21, wherein the etch selectivity layer comprises a material selected from the group consisting of silicon rich oxide, silicon nitride, amorphous silicon, and a combination thereof.

23. The method of claim 21, wherein the etch operation comprises dry etching using a sputtering process and dry etching using a reactive plasma process.

* * * * *